(12) United States Patent
Tamukai

(10) Patent No.: US 6,262,589 B1
(45) Date of Patent: Jul. 17, 2001

(54) TFT ARRAY INSPECTION METHOD AND DEVICE

(75) Inventor: Tadashi Tamukai, Tokyo (JP)

(73) Assignee: Asia Electronics, Inc., Tokyo (JP)

( * ) Notice: Subject to any disclaimer, the term of this patent is extended or adjusted under 35 U.S.C. 154(b) by 0 days.

(21) Appl. No.: 09/317,202

(22) Filed: May 24, 1999

(30) Foreign Application Priority Data

May 25, 1998 (JP) .................................................. 10-142663

(51) Int. Cl.⁷ .................................................. G01R 31/02
(52) U.S. Cl. .......................................... 324/770; 324/681
(58) Field of Search .................................. 324/770, 681, 324/684, 769

(56) References Cited

U.S. PATENT DOCUMENTS

| | | | |
|---|---|---|---|
| 4,295,091 | * 10/1981 | Ponkala .................................. | 324/684 |
| 5,539,326 | * 7/1996 | Takahashi et al. .................... | 324/770 |
| 5,561,381 | * 10/1996 | Jenkins et al. ........................ | 324/770 |
| 5,576,730 | * 11/1996 | Shimada et al. ...................... | 324/770 |
| 5,639,390 | * 6/1997 | Iino et al. .............................. | 324/770 |

FOREIGN PATENT DOCUMENTS 3-200121    9/1991   (JP) .

* cited by examiner

Primary Examiner—Ernest Karlsen
(74) Attorney, Agent, or Firm—Oliff & Berridge, PLC

(57) ABSTRACT

The pixel capacitances of an LCD array can be inspected easily and in a short time without being affected by the capacitance of the tester system. On the first occasion, pixel capacitance $C_P$ is charged with pixel voltage $V_P$ and line capacitance $C_S$ ($C_S \gg C_P$) that is connected in parallel with pixel capacitance $C_P$ is charged with set voltage $V_S$ ($V_P \neq V_S$). By connecting pixel capacitance $C_P$ and line capacitance $C_S$ is parallel, the difference voltage $\Delta V_{S1}$ of the voltage of the line capacitance $C_S$ after the parallel connection and the set voltage $V_S$ that is charged thereon before the parallel connection is measured. On the second occasion, pixel capacitance $C_P$ is charged with pixel voltage $V_P$ and a known reference capacitance $\Delta C_S$ is connected in parallel with line capacitance $C_S$, this being charged with set voltage $V_S$. By further connecting in parallel pixel capacitance $C_P$ with the parallel-connected line capacitance and reference capacitance $\Delta C_S$, the difference voltage $\Delta V_{S2}$ of the line capacitance $C_S$ after this parallel connection and the set voltage $V_S$ that was charged thereon prior to the parallel connection is measured. The pixel capacitance $C_P$ is found from these difference voltages $\Delta V_{S1}$, $\Delta V_{S2}$ measured on the first and second occasion and an equation $C_P = \Delta C_S \cdot \Delta V_{S1} \cdot \Delta V_{S2} / ((V_P - V_S) \cdot (\Delta V_{S1} - \Delta V_{S2}))$ derived from the difference voltages.

15 Claims, 7 Drawing Sheets

⇒

$$\Delta V_{S1} = V_{a1} - V_S$$
$$\approx (C_P/C_S) \cdot (V_P - V_S)$$

⇒

$$\Delta V_{S2} = V_{a2} - V_S$$
$$\approx (C_P/(C_S + \Delta C_S)) \cdot (V_P - V_S)$$

$$C_P = \Delta C_S \cdot \Delta V_{S1} \cdot \Delta V_{S2} / ((V_P - V_S) \cdot (\Delta V_{S1} - \Delta V_{S2}))$$

⇒

$$V_a = (C_T \cdot V_S + C_P \cdot V_P)/(C_T + C_P)$$

$$\Delta V_S = V_a - V_S$$
$$= (C_P/(C_T + C_P)) \cdot (V_P - V_S)$$
$$\approx (C_P/C_T) \cdot (V_P - V_S)$$
$$C_T \gg C_P$$

Cp charged to Vp

Cp isolated

Cs charged to Vs

DAC isolated

First measurement

Cp charged to Vp

Cp isolated

DAC isolated

Cs charged to Vs

Second measurement

Wait for prescribed time

TFT ARRAY INSPECTION METHOD AND DEVICE

BACKGROUND OF THE INVENTION

1. Field of the Invention

The present invention relates to a method of inspecting a TFT (Thin-Film Transistor) array and device therefor, and, in particular, a method and device for inspecting the individual pixels constituting an LCD array.

2. Description of the Related Art

In a TFT-LCD, the TFTs are turned ON by applying voltage to their RGB inputs, and the voltage is held by the pixel capacitances by turning the TFTs OFF after the pixel capacitances have been charged. The liquid crystal shutters control the brightness by means of the voltage held on these pixel capacitances. It is therefore extremely important, for the TFT-LCD, to know the pixel capacitances. To this end, it is necessary to inspect not only the pixel capacitances before and after liquid crystal implantation, but also the parameters of the pixels constituting the TFT array i.e. whether or not the pixel capacitances are connected (open-circuit defects and short-circuit defects) and whether or not the pixel capacitance is sufficient to ensure sufficient voltage for holding the image signal during the period of a single frame.

In this inspection, as shown in FIG. 6, a test circuit 22 is connected to the RGB input of pixel 20 constituting the TFT array, and TFT 21 is turned ON, thereby charging pixel capacitance $C_P$ with voltage from test circuit 22; TFT 21 is then turned OFF so that the voltage is held in pixel capacitance $C_P$; the charge stored on pixel capacitance $C_P$ is ascertained from the charging current and/or held voltage when this is done. However, correctly inspecting the charge held on the pixel capacitances of the TFT array at high speed is very difficult, for the following reasons.

(1) The value of the pixel capacitance $C_P$ is very small, at 0.1 pF~0.2 pF.

(2) When the voltage charged on pixel capacitance $C_P$ is read by turning on TFT 21, since the capacitance $C_T$ (~100 pF) of the tester system that is connected in parallel with pixel element $C_P$ and/or the pattern capacitance $C_N$ of the pixel (maximum 100 pF) are at least 1000 times pixel capacitance $C_P$, the voltage that is read out is extremely small.

(3) Not only are the values of $C_T$ and $C_N$ large, but they have large variability and difference, unknown values for each circuit.

A prior art inspection circuit for inspecting the charge of the pixel elements of a TFT array for avoiding the problems (1) and (3) above was proposed as Laid-Open Patent Application No. H.3-200121. In this, as shown in FIG. 7, the source of TFT 31 is connected to pixel capacitance $C_P$ of the TFT array and an integration circuit 33 is connected to the drain of TFT 31 through data line 32. Gate poser source voltage $V_C$ for driving this is applied to the gate of TFT 31. In inspection circuit 34, a switch $S_1$ that disconnects source voltage $V_D$ on data line 32 and the switch $S_2$ that disconnects data line 32 with integrating circuit 33 are provided; when switch $S_1$ is turned ON, drain power source voltage $V_D$ is applied to data line 32 and when TFT 31 is turned ON, the pixel capacitance $C_P$ of the TFT array is charged by drain power source voltage $V_D$. Also, when switch $S_2$ is turned ON, data line 32 is connected to integrating circuit 33 and when TFT 31 is turned ON, the charge stored on TFT array pixel capacitance $C_P$ is applied to integrating circuit 33.

Integrating circuit 33 comprises an operational amplifier 35, a capacitance $C_L$ inserted in a feedback path connected to inverted input 37 from operational amplifier output 36, and a reset switch $S_3$ connected to both ends of capacitance $C_L$ whereby charge stored on capacitance $C_L$ is discharged. The capacitance $C_{GD}$ indicated by the broken line is the stray capacitance between the gate and drain on TFT 31; likewise, capacitance $C_D$ and resistance $R_D$ are the stray capacitance and stray resistance of the drain.

As shown in FIG. 8, after the rise of $V_D$ and turning switch $S_1$ ON, gate power source voltage $V_G$ is applied to TFT 31 from time-point $T_3$ to time-point $T_4$, thereby turning TFT 31 ON and charging TFT array pixel capacitance $C_P$ with the drain power source voltage $V_D$ supplied through data line 32. At time $T_5$, by the drop of drain power source voltage $V_D$, the charge stored on stray capacitance $C_D$ of data line 32 is discharged. By turning switch $S_1$ OFF, drain power source voltage $V_D$ is isolated and, by turning switch $S_2$ ON, data line 32 is connected to integrating circuit 33. Also, by turning reset switch $S_3$ OFF, feedback capacitance $C_L$ is made capable of being charged. During the period necessary for charging feedback capacitance $C_L$ and discharging TFT array pixel capacitance $C_P$ i.e. from time-point $T_9$ to time-point $T_{10}$, gate power source voltage $V_G$ is again applied to TFT 31, thereby turning TFT 31 ON, so that the voltage on data line 32 is applied to the inverted input of operational amplifier 35. During this period, the waveform appearing at the output of the operational amplifier drops off after charging has been saturated (due to the inverted output, this appears inverted in the Figure).

The reason that such a waveform is produced is that, although the feedback capacitance $C_L$ is initially charged and subsequently saturated by the voltage of both of TFT array pixel capacitance $C_P$ and gate/drain stray capacitance $C_{GD}$, since the gate power source voltage $V_G$ drops at time-point $T_{10}$, the voltage of the operational amplifier output is reduced by the amount of its charge (appearing inverted in the Figure), since this charge is removed from the gate/drain stray capacitance $C_{GD}$. After the time-point $T_{10}$, since the voltage of gate/drain stray capacitance $C_{GD}$ is removed, the voltage of the output of the operational amplifier becomes practically proportional to the voltage stored on TFT array pixel capacitance $C_P$ from time-point $T_4$ to end time $T_9$ i.e. the holding period. Various parameters of the pixel can then be analysed using the output voltage at this point. For example, the pixel capacitance $C_P$ is defined as a function of the voltage of the operational amplifier output, and the LCD leakage resistance is defined as a function of the holding period (period $T_4$ to $T_9$).

However, with the inspection circuit of Laid-Open Patent Application No. H.3-200121 described above, as will be described, there was the problem that the construction was complicated and the inspection time-consuming, with the result that a rapid test could not be performed.

(1) The construction was complicated due to the fact that three switches were required, including the integrator and integrator reset switch.

(2) Measurement errors were considerable since an integrator of small time constant was needed, with the result that this was easily affected by noise and/or charge injected from the reset switch of the integrator.

(3) The measurement time was long since the mean value of several measurements had to be found in order to avoid the effects of noise.

SUMMARY OF THE INVENTION

An object of the present invention is to solve the above problems of the prior art and to provide a TFT array inspection method and device whereby whether the pixels constituting a TFT array are good or not can be correctly inspected at high sped and pixel capacitance can be accurately found.

A first aspect of the invention consists in a method of TFT array inspection characterized in that the step of inspecting a pixel constituting the TFT array includes a step of: charging said pixel capacitance $C_P$ with a known pixel voltage $V_P$ and charging an additional capacitance $C_T$ ($C_T \gg C_P$) connected in parallel with said pixel capacitance $C_P$ during inspection of the TFT array with a known set voltage ($V_P \neq V_S$), after the charging of both of these, connecting pixel capacitance $C_P$ and additional capacitance $C_T$ in parallel, and measuring the difference voltage $\Delta V_S$ of the voltage $V_a$ of the additional capacitance $C_T$ after the parallel connection and the set voltage $V_S$ that was charged on additional capacitance $C_T$ prior to the parallel connection, and utilizing this measured difference voltage $\Delta V_S$ and the following equation derived from this difference voltage:

$$\Delta V_S = V_a - V_S =: (C_P/C_T) \cdot (V_P - V_S) \qquad (1)$$

(where =: means "approximately equal to").

Here, the additional capacitance $C_T$ that is connected in parallel with said pixel capacitance $C_P$ during inspection of the TFT array means the total equivalent capacitance on the measurement line when the test system is connected to the TFT array. Specifically, it includes the capacitance possessed by the tester system and the capacitance on the array side apart from the pixel capacitance and, in addition, may include the known reference capacitance that is deliberately connected to the measurement line.

As mentioned above, additional capacitance $C_T$ includes the capacitance possessed by the tester system and the capacitance on the array side apart from the pixel capacitance and, in addition, may further include a reference capacitance that is deliberately connected to the measurement line. Of these, the capacitance possessed by the tester system and the capacitance on the array side apart from the pixel capacitance have variability, so they are difficult to ascertain precisely. Consequently, in the additional capacitance $C_T$, the pixel capacitance $C_P$ can be accurately measured if there exists a relationship for finding pixel capacitance $C_P$ which is independent of the unknown capacitance components which are difficult to ascertain and the voltage which is charged on to these unknown capacitance components.

Now in the above equation (1) for finding the difference voltage $\Delta V_S$ of the voltage after parallel connection of additional capacitance $C_T$ and the charging voltage prior to parallel connection, the voltage $V_a$ of the additional capacitance $C_T$ after the parallel connection is not included. Consequently, if $\Delta V_S$ is known by measurement, in equation (1), apart from the pixel capacitance $C_P$ and additional capacitance $C_T$, all the terms are known, so if the additional capacitance $C_T$ or its unknown capacitance constituents can be excluded from equation (1), the pixel capacitance $C_P$ can be easily found without having to consider the voltage $V_a$ after parallel connection.

For example, in equation (1), the unknown capacitance constituents of additional capacitance $C_T$ can be excluded by repeating twice the algebraic calculation of the combined voltage and the charging voltage of additional capacitance $C_T$ prior to the combination, by changing the value of the additional capacitance $C_T$ and connecting in parallel (combining) the pixel capacitance $C_P$ and additional capacitance $C_T$ charged to respectively different voltages. In this way, pixel capacitance $C_P$ can easily be found.

A second aspect of the invention consists in a method of TFT array inspection characterized in that a pixel capacitance $C_P$ constituting the TFT array is charged with pixel voltage $V_P$ and the line capacitance $C_S$ that is connected in parallel with pixel capacitance $C_P$ during TFT array inspection ($C_S \gg C_P$) is charged with set voltage $V_S$ ($V_P \neq V_S$), after the charging up of both of these, pixel capacitance $C_P$ and line capacitance $C_S$ are connected in parallel and the difference voltage $\Delta V_{S1}$ of the voltage $V_{a1}$ of line capacitance $C_S$ after the parallel connection and a set voltage $V_S$ that is charged on to line capacitance $C_S$ before the parallel connection is made is measured, next, pixel capacitance $C_P$ is charged with pixel voltage $V_P$ and a known reference capacitance $\Delta C_S$ is connected in parallel with said line capacitance $C_S$ and these are charged with set voltage $V_S$, after both of these have been charged, pixel capacitance $C_P$ is further connected in parallel with said parallel-connected line capacitance and reference capacitance $\Delta C_S$, and the difference voltage $\Delta V_{S2}$ of the voltage $V_{a2}$ of line capacitance $C_S$ after this parallel connection and a set voltage $V_S$ charged on to line capacitance $C_S$ prior to the parallel connection is measured, pixel parameters are inspected from said measured difference voltages $\Delta V_{S1}$, $\Delta V_{S2}$, and said pixel capacitance $C_P$ is found from these difference voltages and the following equation derived from the difference voltages:

$$C_P = \Delta C_S \cdot \Delta V_{S1} \cdot \Delta V_{S2} / ((V_P - V_S) \cdot (\Delta V_{S1} - \Delta V_{S2})) \qquad (2)$$

Here the line capacitance $C_S$ that is connected in parallel with the pixel capacitance $c_P$ on inspection of the TFT array means the equivalent capacitance that is unavoidably attached to the measurement line when the tester system is connected to the TFT array and specifically includes the capacitance possessed by the test system itself and the capacitance on the array side apart from the pixel capacitance.

On the occasion of the first charging, set voltage $V_S$ is applied to line capacitance $C_S$ and pixel voltage $V_P$ is applied to pixel capacitance $C_P$ respectively. After this, the two capacitances $C_S$ and $C_P$ are combined. From equation (1), the voltage difference $\Delta V_{S1}$ between the voltage $V_{a2}$ of the line capacitance $C_S$ after combination and the set voltage $V_S$ that was charged on to it prior to combination is:

$$\Delta V_{S1} = V_{a1} - V_S = (C_P/C_S) \cdot (C_P - V_S) \qquad (3)$$

On the second occasion of charging, after applying pixel voltage $V_P$ to pixel capacitance $C_P$ set voltage $V_S$ is applied to the combined reference capacitance $\Delta C_S$ and line capacitance $C_S$. After this, pixel capacitance $C_P$ is further combined with the combined reference capacitance $\Delta C_S$ and line capacitance $C_S$. The voltage difference $\Delta V_{S2}$ of the voltage $V_{a2}$ of line capacitance $C_S$ after combination and the set voltage $V_S$ that was charged thereon prior to combination, from equation (1), is also:

$$\Delta V_{S2} = V_{a2} - V_S = (C_P/(C_S + \Delta C_S)) \cdot (C_P - V_S) \qquad (4)$$

From equations (3) and (4) an equation (2) to find the pixel capacitance $C_P$ is obtained. If the difference voltages $\Delta V_{S1}$, $\Delta V_{S2}$ obtained by the first and second chargings are known by measurement, all the terms on the right-hand side of equation (2) are known. Consequently, even if combined voltages $V_{a1}$, $V_{a2}$ and line capacitance $C_S$ are all unknown, pixel capacitance $C_P$ can be found independently of these. Thus, with the second invention, the pixel capacitance can be inspected in a speedy, accurate and easy manner by a simple method of making tow voltage measurements and performing an algebraic calculation.

A third aspect of the invention, in the second aspect of the invention, consists in a method of TFT array inspection characterized in that, after holding the pixel voltage $V_S$ of the pixel capacitance $C_P$ for a prescribed time after said two have been charged, pixel capacitance $C_P$ is further connected in parallel with said parallel-connected line capacitance and reference capacitance $\Delta C_S$, and the difference voltage $\Delta V_{S1}$ of the voltage $V_{a2}$ of the line capacitance $C_S$ after this parallel connection and the set voltage $V_S$ charged on the line capacitance $C_S$ prior to the parallel connection is measured.

Since in fact pixel capacitance $C_P$ is subject to leakage, it is necessary to confirm that the voltage for holding the image signal for a period of one frame is preserved on pixel capacitance $C_P$. For this reason, when the potential difference $V_{S2}$ on the second occasion is found, the pixel voltage $V_P$ that was charged on to pixel capacitance $C_P$ is held for a prescribed time and the pixel voltage $V_P$ after the prescribed time is then arranged to be included in the measurement. By this means, the holding capability of pixel capacitance $C_P$ can be inspected by comparison of the potential difference $V_{S2}$, which is correlated with the pixel voltage $V_P$, with a prescribed value.

A fourth aspect of the invention consists in a TFT array inspection device comprising: a power source capable of selectively applying two voltages, namely, pixel voltage $V_P$ and set voltage $V_S$ ($V_P \neq V_S$); a pixel constituting the TFT array and including a pixel capacitance $C_P$ and TFT switch $SW_1$ connected to the path thereof; a line for connecting said power source to said pixel; a line capacitance $C_S$ ($C_S \gg C_P$) connected in parallel with said line on TFT array inspection; a known reference capacitance $\Delta C_S$; a switch $SW_2$ for connecting a parallel or isolating said reference capacitance $\Delta C_S$ with respect to said line capacitance $C_S$; a switch $SW_3$ for turning ON/OFF said line; and a calculation control circuit whereby the voltage difference of the voltage after parallel connection of said line capacitance $C_S$ and the charged voltage prior to parallel connection is measured twice and the pixel capacitance $C_P$ is found using these measurement results.

Said calculation control circuit performs ON/OFF control of said TFT switch $SW_1$, switch $SW_2$ and $SW_3$ such that, in order to measure the voltage difference of line capacitance $C_S$ on the first occasion, the pixel capacitance $C_P$ of said pixel is charged to pixel voltage $V_P$ by connecting said power source to said line and the line capacitance $C_S$ is charged with set voltage $V_S$ by isolating pixel capacitance $C_P$ from the line, after charging up both of these, said power source and said pixel are isolated and said pixel capacitance $C_P$ and said line capacitance $C_S$ are connected in parallel; and, in order to measure the voltage difference of the line capacitance $C_S$ on the second occasion, said reference capacitance $\Delta C_S$ and said line capacitance $C_S$ are connected in parallel, said power source is connected to said line thereby charging up pixel capacitance $C_P$ with pixel voltage $V_P$, and, by isolating pixel capacitance $C_P$ from the line, said reference capacitance $\Delta C_S$ and said line capacitance $C_S$ that were connected in parallel are charged with set voltage $V_S$ and, after charging up both of these, the pixel voltage $V_P$ charged on to said pixel capacitance $C_P$ for a prescribed time is held, and pixel capacitance $C_P$ after the lapse of a prescribed time is further connected in parallel with said parallel-connected reference capacitance $\Delta C_S$ and said line capacitance $C_S$.

On the first occasion, under control exercised by the calculation control circuit, switches $SW_1$, $SW_3$ are turned ON, thereby connecting the power source to the pixel and enabling pixel voltage $V_P$ to be supplied to the pixel from the power source; this is charged on to pixel capacitance $C_P$.

When pixel capacitance $C_P$ is isolated from the power source by turning switch $SW_1$ OFF, set voltage $V_S$ is applied from the power source to the line capacitance $C_S$, thereby charging line capacitance $C_S$ up to the set voltage $V_S$. After this, the pixel is isolated from the power source by turning switch $SW_3$ OFF by means of the calculation control circuit. When switch $SW_1$ is turned ON, thereby combining line capacitance $C_S$ that was charged to set voltage $V_S$ and pixel capacitance $C_P$ that was charged to pixel voltage $V_P$, charging/discharging takes place between these two capacitances. The potential difference $V_{S1}$ between the combination voltage $V_{a1}$ at this point and the set voltage $V_S$ that was charged on to line capacitance $C_S$ prior to the combination is then read by the calculation control circuit. This potential difference $V_{S1}$ that is read is compared with the prescribed value that is obtained with a satisfactory product.

If then the pixel connection is normal, the voltage difference $V_{S1}$ that is read, from equation (1) is:

$$V_{S1}=V_{a1}-V_S \neq 0$$

which is within the prescribed values.

However, if the pixel has an open-circuit fault ($C_P=0$, so-called "no capacitance"), or switch $SW_1$ is fixed ON or fixed OFF, $$V_{S1}=:V_S-V_S=0$$

which is zero, so departing from the prescribed values. Also, if the pixel has a short-circuit fault ($C_P=\infty$), $$V_{S1}=V_{Com}-V_S$$

and therefor has a large value. This also departs from the prescribed values. Consequently, by determining whether the potential difference $\Delta V_{S1}$ that is read by the calculation control circuit is within the prescribed values or not, it is possible to inspect whether the pixel connection is abnormal or normal.

On the second occasion, the power source is connected to the pixel by turning switch $SW_1$, $SW_3$ ON under the control of the calculation control circuit, with the result that pixel voltage $V_P$ is supplied from the power source to the pixel, causing the pixel capacitance $C_P$ to be charged. On turning switch $SW_1$ OFF, pixel capacitance $C_P$ is isolated from the power source and by turning $SW_1$ ON reference capacitance $\Delta C_S$ is combined with line capacitance $C_S$. By changing over the power source from pixel voltage $V_P$ to set voltage $V_S$, this is applied to line capacitance $C_S$ and reference capacitance $\Delta C_S$, causing line capacitance $C_S$ and reference capacitance $\Delta C_S$ to be charged to the set voltage $V_S$. Thereupon the system waits for a prescribed time for inspection of the holding time of pixel capacitance $C_P$.

After the lapse of the prescribed time, the calculation control circuit turns switch $SW_1$ OFF, thereby isolating the pixel from the power source. By turning switch $SW_3$ ON, line capacitance $C_S$ that has been charged to set voltage $V_S$, reference capacitance $\Delta C_S$ and pixel capacitance $C_P$ that holds the pixel voltage $V_P$ after lapse of a prescribed time are combined, and charging/discharging is performed between both capacitances. The calculation control circuit then reads the voltage difference $V_{S2}$ of this combined voltage $V_{a2}$ and the set voltage $V_S$ that was charged on to line capacitance $C_S$ prior to combining. The potential difference $V_{S2}$ that is thus read is compared with the prescribed value that is obtained with a good product.

If there is large leakage, the voltage $V_P$ that is held on pixel capacitance $C_P$ changes to + or −, so the voltage difference $V_{S2}$ becomes outside the prescribed values. Consequently, if it is found that the potential difference $V_{S2}$ that is thus read is outside the prescribed values, it is concluded that a leakage fault exists. As described above, pixel capacitance $C_P$ is found from equation (2).

Thus with the fourth invention, with a simple construction involving only ON/OFF control of switches $SW_1$, $SW_2$, $SW_3$, and without requiring an integrating circuit, and without knowing the value of the line capacitance or pixel capacitance, inspection as to whether or not the pixel connection is good and as to whether or not the voltage of the pixel capacitance was held for the prescribed time can easily be performed.

DETAILED DESCRIPTION OF THE PREFERRED EMBODIMENTS

Embodiments of the invention are described below. First of all, the principles of the invention are described.

Principles of the Invention

These are described using FIG. 1A, FIG. 1B, FIG. 2A and FIG. 2B.

Figure 2A:
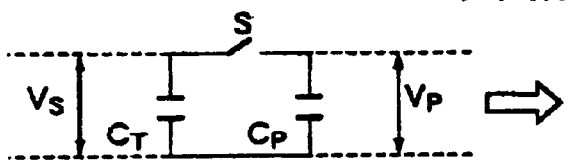
FIG. 2A and FIG. 2B are diagrams of the principles of the invention.
Figure 2A:
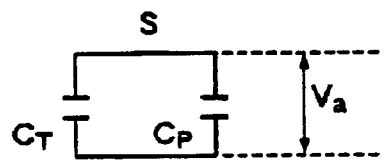
Figure 2B:
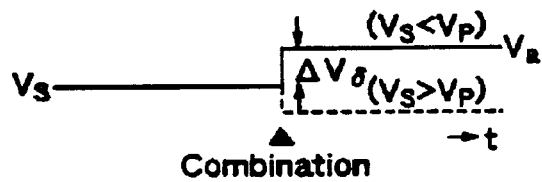

(1) Combined voltage of two charged capacitances $C_T$, $C_P$ (FIG. 2A and FIG. 2B).

(a) Combined voltage (FIG. 2A) when two capacitances $C_T$, $C_P$ are connected in parallel (combination)

After respectively applying $V_S$ volts to capacitance $C_T$ and $V_P$ volts to capacitance $C_P$ in a condition with switch S OFF, the two capacitances $C_T$ and $C_P$ are combined by turning switch S ON. The combined voltage $V_a$ produced at both terminals of the combined capacitance obtained by the combination is:

$$V_a = (C_T \cdot V_S + C_P \cdot V_P)/(C_T + C_P).$$

Thus the combined voltage $V_a$ is the sum of the voltages distributed by the ratio with respect to the combined capacitance $C_O$.

(b) Voltage fluctuation of $C_T$ after combination (FIG. 2B)

The voltage of capacitance $C_T$ in the condition with switch S OFF is $V_S$. Thus the voltage difference $\Delta V_S$ after combination is:

$$\Delta V_S = V_a - V_S$$
$$= (C_P/(C_T + C_P)) \cdot (V_P - V_S)$$
$$\dot{=} (C_P/C_T) \cdot (V_P - V_S) \quad C_T \gg C_P \quad (6)$$

Thus the voltage difference $\Delta V_S$ before and after combination is not dependent on the combination voltage $V_a$.

Figure 1A:
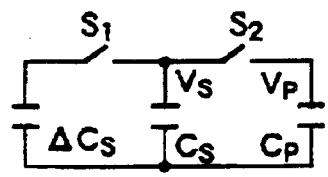
FIG. 1A and FIG. 1B are diagrams illustrating the concept of a TFT array inspection device.
Figure 1A:
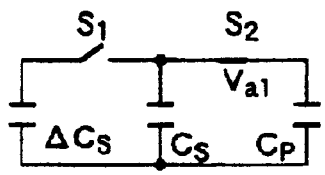
Figure 1B:
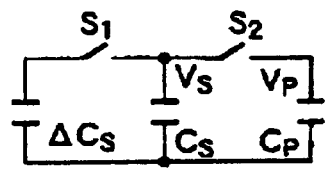
Figure 1B:
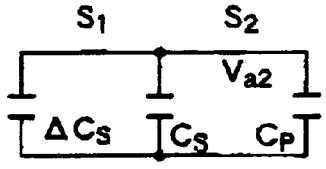

(2) Method of finding the values of capacitances $C_P$ and $C_S$ where these are not known (FIG. 1A and FIG. 1B).

The values of capacitances $C_P$ and $C_S$ can be found by the following procedure by connecting and disconnecting a known capacitance $\Delta C_S$. In this case the capacitance $C_T$ is the combined capacitance when known capacitance $\Delta C_S$ is combined with capacitance $C_S$.

(a) $\Delta C_S$ not connected (FIG. 1A)

In a condition with switches $S_1$ and $S_2$ OFF, $V_S$ volts are applied to capacitance $C_S$ and $V_P$ volts to capacitance $C_P$, respectively. After this, switch $S_2$ is turned ON and both capacitances $C_S$ and $C_P$ are combined. The voltage difference $\Delta V_{S1}$ of capacitance $C_S$ before and after combination is as given by equation (3).

(b) $\Delta C_S$ connected (FIG. 1B)

Capacitances $\Delta C_S$ and $C_S$ are combined by turning switch $S_1$ ON and $V_S$ volts are applied thereto. After this, switch $S_2$ is turned ON and combination is effected with a further capacitance $C_P$. The voltage difference $\Delta V_{S2}$ of the capacitance $C_S$ before and after combination is as given by equation (4).

Equation (2) is derived form equations (3) and (4) and the following equation is obtained for the line capacitance $C_S$:

$$C_S = \Delta C_S \cdot \Delta V_{S2}/(\Delta V_{S1} - \Delta V_{S2}) \quad (5)$$

This means that, since the capacitance $\Delta C_S$ is known, if the values of the two voltages $V_S$ and $V_P$ applied to the capacitance are known and the combined voltages $\Delta V_{S1}$ and $\Delta V_{S2}$ can be measured, the pixel capacitance $C_P$ and line capacitance $C_S$ can be found. The present invention utilizes this principle to ascertain whether the pixel capacitances are good or not and to calculate the capacitance values.

Embodiment

Figure 3:
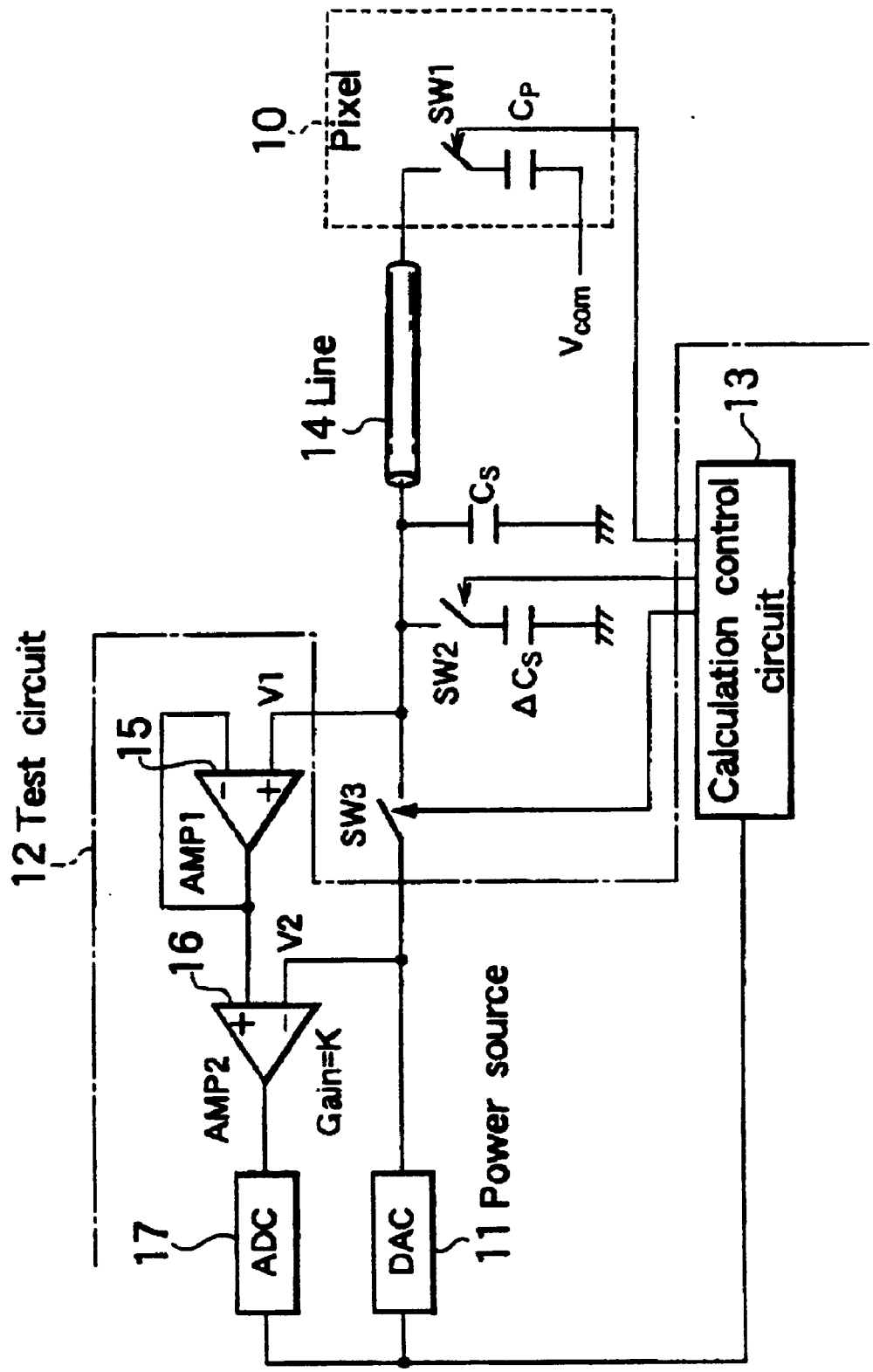
FIG. 3 is a layout diagram of a TFT array inspection device according to an embodiment.

An inspection device for a TFT array is shown in FIG. 3. The layout of pixel 10 is shown diagrammatically as a series circuit of a pixel capacitance $C_P$ whereof one end is dropped to common voltage $V_{Com}$ and a TFT switch $SW_1$ that turns ON/OFF the path to the other end of pixel capacitance $C_P$. The output terminal DAC 11 constituting a power source on a line 14 consisting of a coaxial cable or shielded cable is connected to the TFT switch $SW_1$ side of this pixel 10, so that the voltage of line capacitance $C_S$ that is connected between line 14 and earth, or the voltage of pixel capacitance $C_P$ of pixel 10 can be charged/discharged by the output voltage of DAC 11. A switch $SW_3$ is interposed between line 14 and DAC 11, enabling DAC 11 to be connected or isolated with respect to pixel 10.

The other end of a reference capacitance $\Delta C_S$ whereof one end is earthed is connected through switch $SW_2$ to the connection point of line 14 and switch $SW_3$, so that, by turning switch $SW_3$ ON/OFF, reference capacitance $\Delta C_S$ can be connected or isolated with respect to line 14. The capacitance value of reference capacitance $\Delta C_S$ is known.

Also, it is arranged that, by connecting test circuit 12 to the connection point of line 14 and switch $SW_3$, the terminal voltage of the resultant capacitance of line capacitance $C_S$ and pixel capacitance $C_P$, or the terminal voltage $V_1$ of the resultant capacitance of reference capacitance $\Delta C_S$, line capacitance $C_S$ and pixel capacitance $C_P$ and the charging voltage $V_2$ and DAC 11 can be measured.

Test circuit 12 is a known circuit and comprises a low-input current follower 15 that effects impedance conversion of the voltage $V_1$ of the connection point of line 14 and switch $SW_3$, and K-times differential amplifier 16 that has two inputs, namely, the output of this low-input current follower 15 and the output $V_2$ of DAC 11; the output of differential amplifier 16

$$K \cdot (V_2 - V_1)$$

is applied to ADC 17 and various types of decision relating to the pixel parameters are performed by inputting this to operational control circuit 13. Switches $SW_1$, $SW_2$, and $SW_3$ are controlled by operation control circuit 13.

DAC 11 may be constituted by a programmable voltage generator capable of generating any desired voltage.

Line capacitance $C_S$ comprises the test system capacitance referred to above (about 30 pF to 100 pF) plus the capacitances of the array other than the pixel capacitance (about 100 pF). Pixel capacitance $C_P$ without the liquid crystal is about 0.1 pF and when the liquid crystal is inserted becomes about 0.2 pF. Reference capacitance $\Delta C_S$ is determined between for example 50 pF and 100 pF. If charge injection into the line capacitance occurs when switch $SW_3$ isolates DAC 11, measurement error is produced, so, in general, an analog switch, in which the charge injection amount is large and the charge injection amount is unstable, is unsuitable; a photo MOS switch, the absolute value of whose charge injection amount is small, is therefore desirable. Switch $SW_2$ could be a photo MOS switch, but, since it is the switch that turns ON/OFF reference capacitance $\Delta C_S$, an analog switch is sufficient. Switch $SW_1$ is a TFT switch. ADC 17 is an A/D converter, and DAC 11 is a D/A converter for setting the $V_P$ and $V_S$.

The procedure for performing a test in respect of a single pixel using the construction described above will now be described using the inspection procedure of FIG. 4A–FIG. 4K.

Figure 4A:
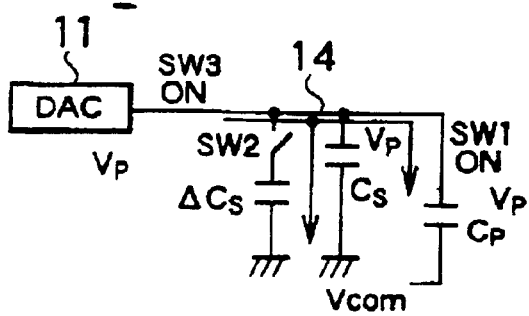
FIG. 4A–FIG. 4K are diagrams illustrating the procedure for a method of TFT array inspection according to an embodiment.

(a) Charging pixel capacitance $C_P$ with pixel voltage $V_P$ (FIG. 4A)

After connecting pixel capacitance $C_P$ and line capacitance $C_S$ in parallel by turning switch $SW_1$ ON, DAC 11 is connected to pixel 10 by turning switch $SW_3$ ON. At this point, the output of DAC 11 is made $V_P$, so line capacitance $C_S$ and pixel capacitance $C_P$ are both charged to $V_P$.

Figure 4B:
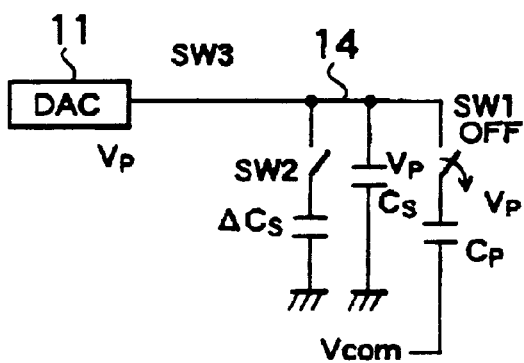

(b) Isolation from pixel capacitance $C_P$ (FIG. 4B)

Pixel capacitance $C_P$ is isolated from DAC 11 by turning off switch $SW_1$.

Figure 4C:
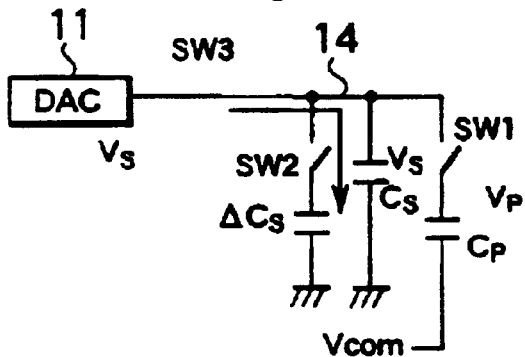

(c) Charging of line capacitance $C_S$ to set voltage $V_S$ (FIG. 4C)

In a condition with pixel capacitance $C_P$ isolated from DAC 11, the set voltage $V_S$ is charged on to line capacitance $C_S$ by changing over the output of DAC 11 from pixel voltage $V_P$ to set voltage $V_S$.

Figure 4D:
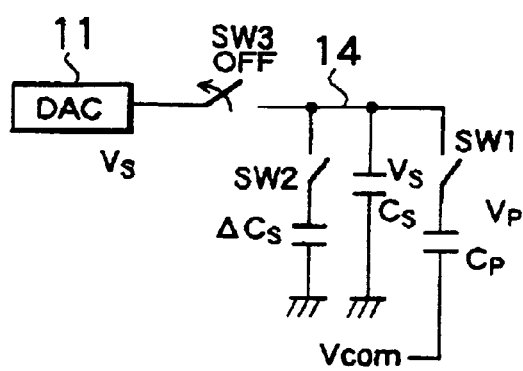

(d) Isolation of DAC (FIG. 4D)

DAC 11 is isolated from line 14 by turning off switch $SW_3$.

Figure 4E:
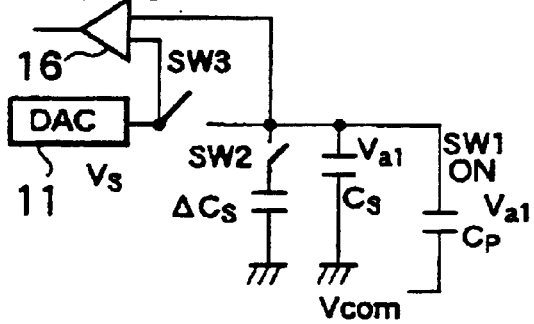
Figure 4F:
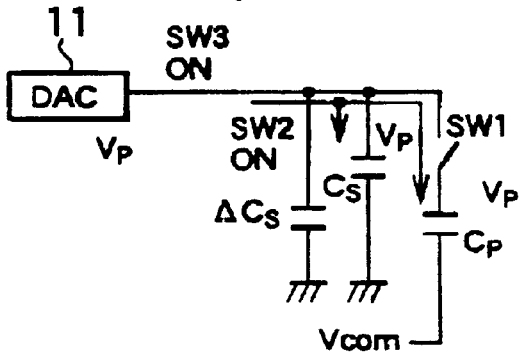
Figure 4G:
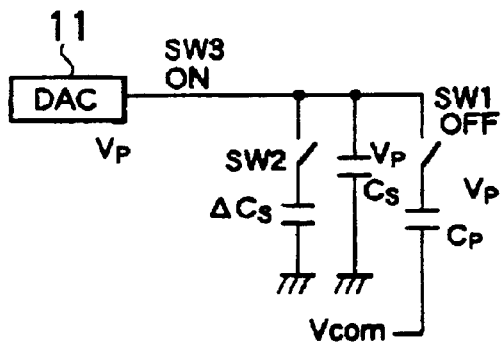

(e) Combination, measurement and partial determination (FIG. 4E)

By connecting in parallel line capacitance $C_S$ and pixel capacitance $C_P$ by turning switch $SW_1$ ON, the difference between the resultant voltage $V_{a1}$ that is charged on the resultant capacitance and the charging voltage $V_S$ of DAC 11 is multiplied by a factor of K.

$$K (V_{a1} - V_S)$$

holding of a pixel signal for a period of one frame can be maintained. This is to inspect the holding time of pixel capacitance $C_P$.

Figure 4J:
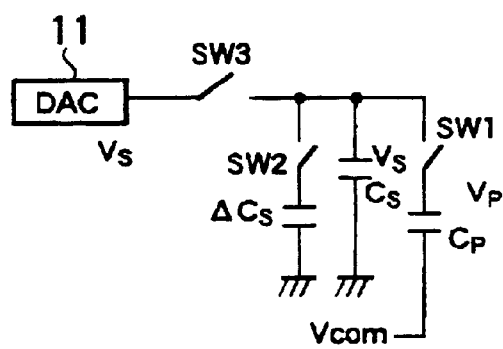
Figure 4H:
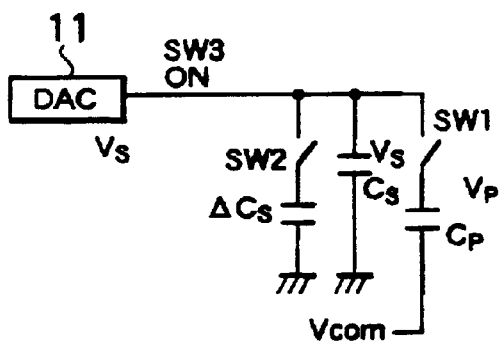

(j) Isolation of DAC (FIG. 4J)

DAC 11 is isolated from pixel 10 by turning off switch $SW_3$.

Figure 4K:
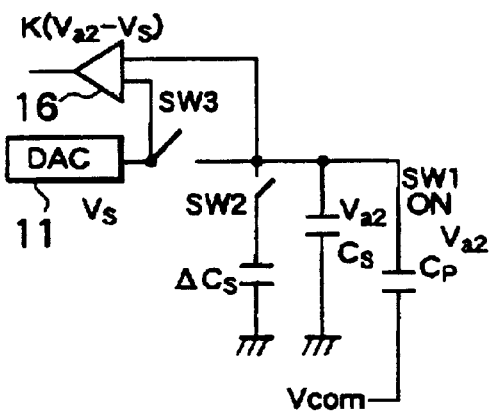
Figure 4I:
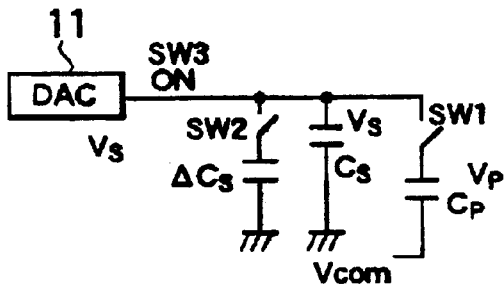

(k) Combination, measurement, partial evaluation (FIG. 4K)

By turning switch $SW_1$ ON, parallel connection is effected of pixel capacitance $C_P$ which is holding voltage after the lapse of a prescribed time, and the resultant capacitance of the line capacitance $C_S$ and the reference capacitance $\Delta V_S$ which are charged to $V_S$. The difference between the voltage $V_{a2}$ of the resultant capacitance and the charging voltage $V_S$ of DAC 11 is then multiplied by K:

$$K (V_{a2} - V_S)$$

This value is measured, and partial evaluation of the remaining pixels is performed from this measurement result. Specifically, in the event of large leakage of pixel capacitance $C_P$ i.e. a leakage fault, the voltage $V_P$ held on pixel capacitance $C_P$ changes to + or −, so departing from the prescribed values. Consequently, if, on measuring $\Delta V_S$, it is found that its value departs from the prescribed values, changing to + or −, this is evaluated as a "high leakage" fault.

A fault in which the path resistance to pixel capacitance $C_P$ is abnormally large results in insufficient charging of $C_P$ when the write time of voltage $V_P$ is short, and so is evaluated as the same as "no capacitance".

(1) Calculation of $C_P$ and evaluation as to whether this is satisfactory or not As described above, with this embodiment, it suffices to make two voltage measurements at a single pixel, and there is no need to know the value of the line capacitance. Also, since the technique of charging an integrating circuit is not adopted, the results are unlikely to be affected by noise and even though measurements are performed twice, there is no need to take an average; this therefore enables the measurement time to be shortened.

Figure 5A:
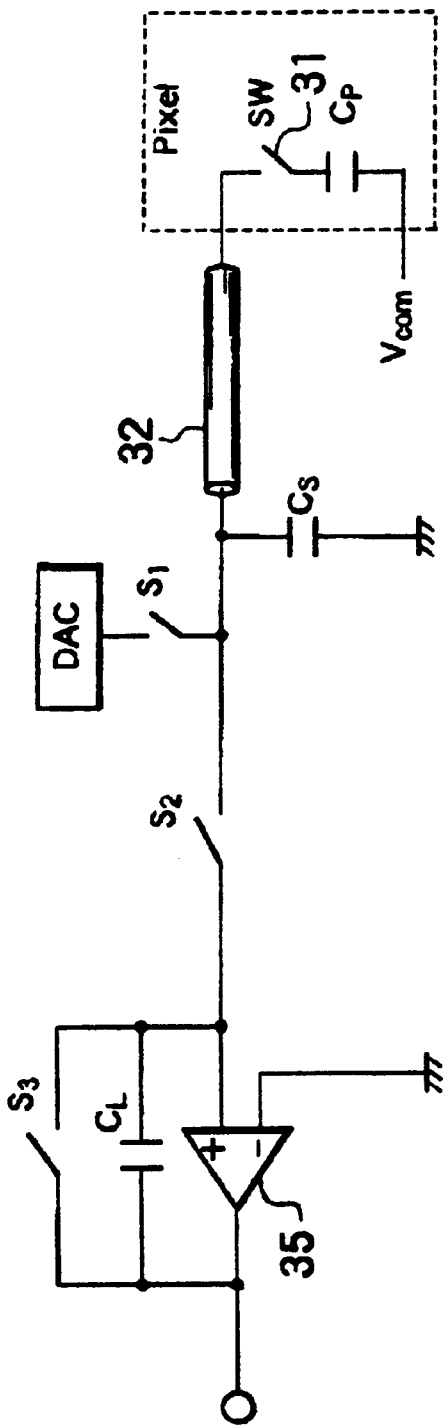
FIG. 5A and FIG. 5B are layout diagrams of a TFT array inspection device comparing a prior art example and an embodiment.
Figure 5B:
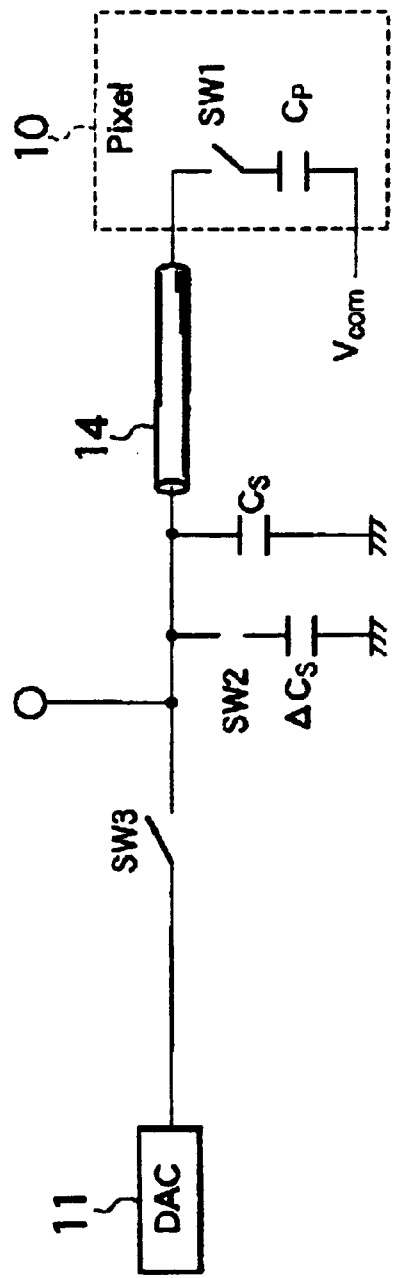
Figure 6:
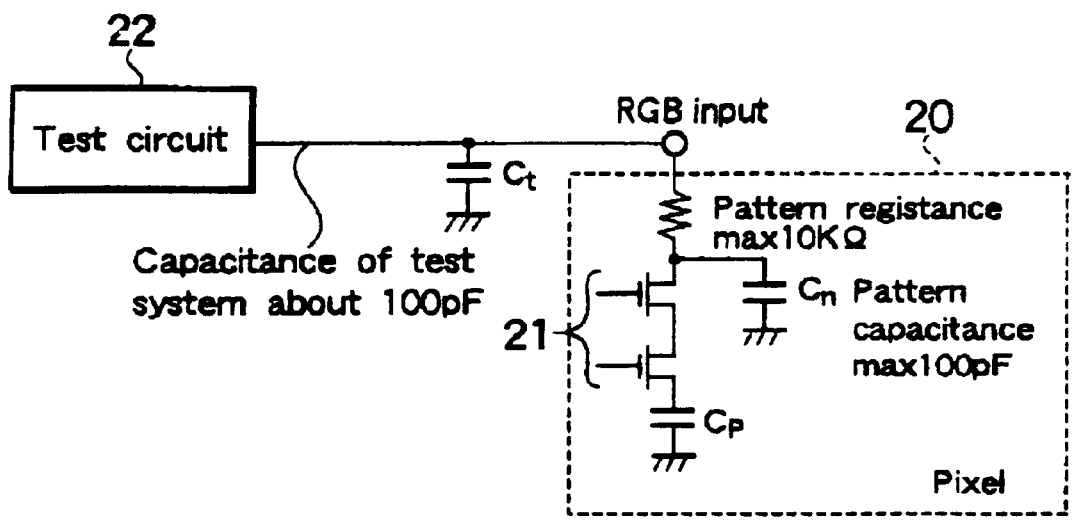
FIG. 6 is a diagram of a TFT array inspection device.
Figure 7:
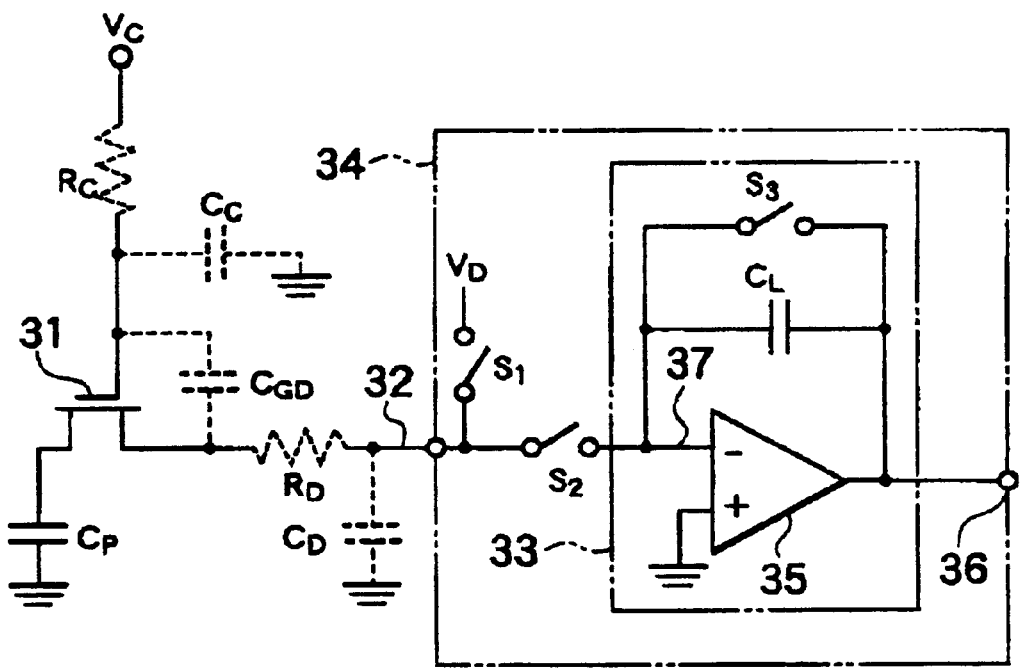
FIG. 7 is a diagram illustrating a prior art example of a TFT array inspection device.
Figure 8:
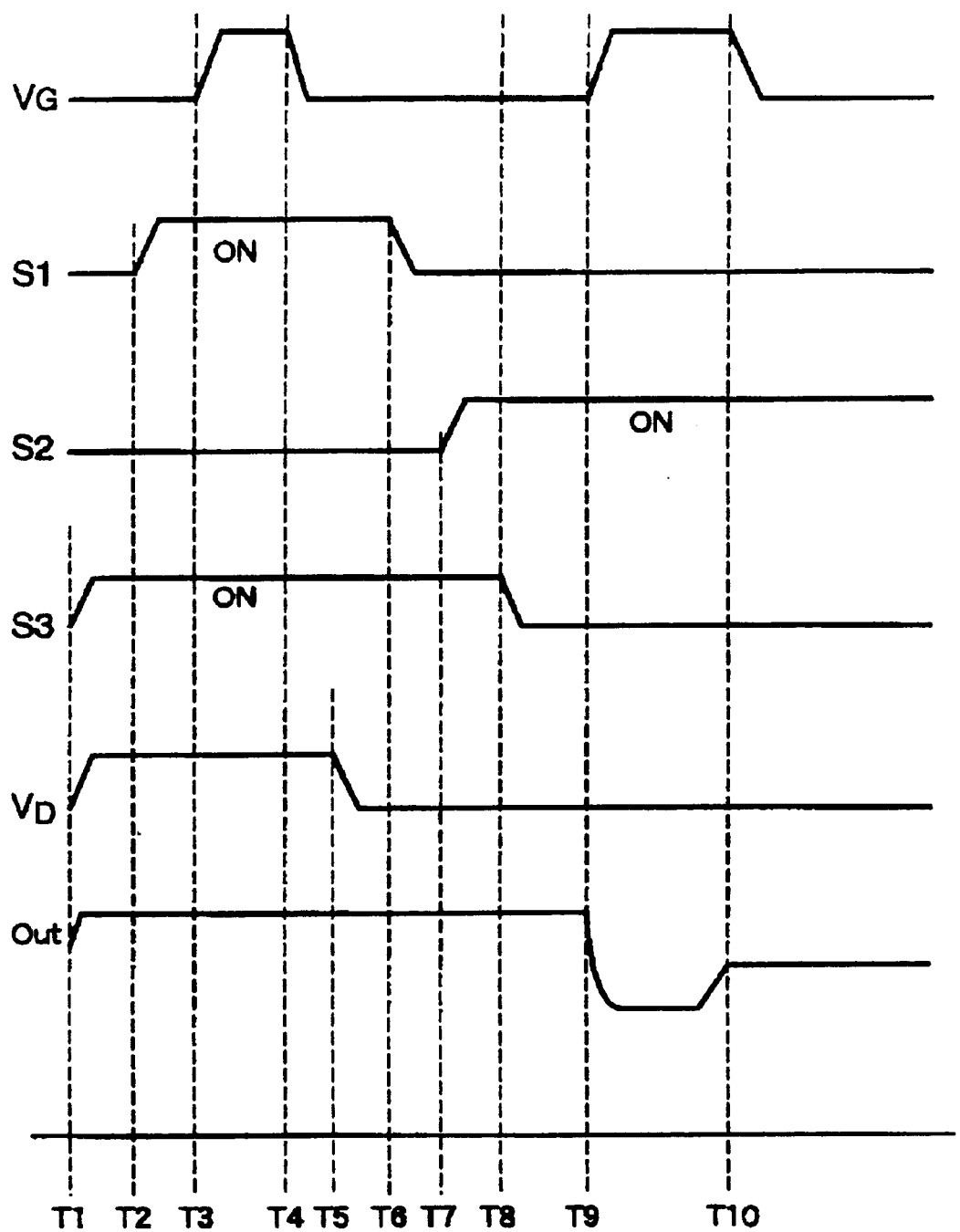
FIG. 8 is a timing chart of a prior art example of a TFT array inspection device.

Also, as shown in the comparison diagrams of FIG. 5A and FIG. 5B of the prior art example (FIG. 5A) and embodiment (FIG. 5B), since the overall layout is extremely straightforward with only two switches SW needing to be mounted in the test system and there being no integrating circuit, the pixel capacitance $C_P$ can be found easily and precisely, and connection checking of the pixel parameters and/or the holding time of pixel capacitance $C_P$ can be inspected in the process of finding pixel capacitance $C_P$.

It should be noted that, although in the above embodiment, inspection of whether the pixel capacitance $C_P$ is zero, short-circuiting of $C_P$, or switch $SW_1$ being fixed ON/OFF is arranged to be performed on the first occasion, it would alternatively be possible to inspect these on the second occasion. Also, although it was arranged for inspection for leakage of pixel capacitance $C_P$ and for path resistance to be performed on the second occasion, it would be possible to inspect for these on the first occasion.

With the method of the present invention, pixel capacitance can be found simply by voltage measurement and algebraic calculation in respect of a single pixel without integration, so the satisfactoriness of the pixels of the TFT array can be inspected accurately, easily and at high speed. Also, with the device of the present invention, the above benefit can be suitably obtained by an uncomplicated construction.

What is claimed is:

1. A method of TFT array inspection comprising the steps of:

charging a pixel capacitance $C_P$ constituting a pixel of a TFT array with a pixel voltage $V_P$ having a known value and charging an additional capacitance $C_T$ ($C_T >> C_P$) with a set voltage $V_S$ ($V_P \neq V_S$) having a known value, said additional capacitance $C_T$ including at least a line capacitance $C_S$ ($C_S >> C_P$) having an unknown value and said additional capacitance $C_T$ being connected in parallel with said pixel capacitance $C_P$ during inspection of said pixel, after the charging of both of these, connecting said pixel capacitance $C_P$ and said additional capacitance $C_T$ in parallel, and measuring a difference voltage $\Delta V_S$ between a voltage $V_a$ of said additional capacitance $C_T$ after the parallel connection and said set voltage $V_S$, said charging and said connecting of said pixel capacitance $C_P$ and said additional capacitance $C_T$ and said measuring being conducted at least twice, by changing a value of said additional capacitance $C_T$ with use of at least one reference capacitance $\Delta C_S$ having a known value, thereby measuring at least two difference voltages $\Delta V_S$ having difference values; and inspecting said pixel based on at least these two measured difference voltages $\Delta V_S$ and the following equation representing these difference voltages $\Delta V_S$:

$$\Delta V_S = V_a - V_S =: (C_P/C_T) \cdot (V_P - V_S)$$

(where =: means "approximately equal to").

2. The method of TFT array inspection according to claim 1 wherein, first, said pixel capacitance $C_P$ is charged with said pixel voltage $V_P$ and said additional capacitance $C_T$ comprising said line capacitance $C_S$ is charged with said set voltage $V_S$, after charging $C_P$ and $C_T$, said pixel capacitance $C_P$ and said additional capacitance $C_T$ are connected in parallel and a difference voltage $V_{S1}$ between a voltage $V_{a1}$ of said additional capacitance $C_T$ after the parallel connection and said set voltage $V_S$ is measured;

next, said pixel capacitance $C_P$ is charged with said pixel voltage $V_P$ and said reference capacitance $\Delta C_S$ is connected in parallel with said line capacitance $C_S$ and said additional capacitance $C_T$ comprising this parallel-connected circuit is charged with said set voltage $V_S$, after $C_T$ and $C_P$ have been charged, said pixel capacitance $C_P$ is further connected in parallel with said additional capacitance $C_T$ and a difference voltage $\Delta V_{S2}$ between a voltage $V_{a2}$ of said additional capacitance $C_T$ after this parallel connection and said set voltage $V_S$ is measured, and a pixel parameter is inspected to see whether said pixel parameter is correct, based on at least one difference voltage of said two measured difference voltages $\Delta V_{S1}$ and $\Delta V_{S2}$; and a value of said pixel capacitance $C_P$ is obtained based on these two measured difference voltages $\Delta V_{S1}$ and $\Delta V_{S2}$ and the following equation:

$$C_P = \Delta C_S \cdot \Delta V_{S1} \cdot \Delta V_{S2} / \{(V_S - V_S) \cdot (\Delta V_{S1} - \Delta V_{S2})\}.$$

3. The method of TFT array inspection according to claim 2 wherein, said pixel parameter includes a plurality of pixel parameters including at least a leakage value of said pixel capacitance $C_P$;

said plurality of pixel parameters are divided into said leakage value and pixel parameters other than said leakage value; and said leakage value is inspected based on one difference voltage of said two difference voltages $\Delta V_{S1}$ and $\Delta V_{S2}$ while said pixel parameters other than said leakage value are inspected based on the other difference voltage of said two difference voltages.

4. A TFT array inspection device comprising:

a power source capable of selectively applying two voltages, namely, a pixel voltage $V_P$ and a set voltage $V_S$ ($V_P \neq V_S$);

a pixel of a TFT array including a pixel capacitance $C_P$ and a TFT switch $SW_1$ connected in series to this pixel capacitance $C_P$;

a line for connecting said power source to said pixel;

a line capacitance $C_S$ ($C_S \gg C_P$) connected in parallel with said pixel capacitance $C_P$ on said pixel inspection;

a reference capacitance $\Delta C_S$ having a known value;

a switch $SW_2$ for connecting in parallel or isolating said reference capacitance $\Delta C_S$ with respect to said line capacitance $C_S$;

a switch $SW_3$ for turning ON/OFF said line; and a calculation control circuit whereby said pixel is inspected by controlling ON/OFF of said TFT switch $SW_1$, switches $SW_2$ and $SW_3$, wherein said calculation control circuit performs ON/OFF of said TFT switches $SW_1$, switches $SW_2$ and $SW_3$, such that first of all, said pixel capacitance $C_P$ is charged with said pixel voltage $V_P$ by connecting said power source to said line and said line capacitance $C_S$ is charged with said set voltage $V_S$ by isolating said pixel capacitance $C_P$ from said line, after charging up both of these, said power source and said pixel are isolated and said pixel capacitance $C_P$ and said line capacitance $C_S$ are connected in parallel whereby a difference voltage $\Delta V_{S1}$ between a voltage $V_{a1}$ of said line capacitance $C_S$ after the parallel connection and said set voltage $\Delta V_S$ is measured;

next, said reference capacitance $\Delta C_S$ and said line capacitance $C_S$ are connected in parallel, said power source is connected to said line thereby charging up said pixel capacitance $C_P$ with said pixel voltage $C_P$, and, by isolating said pixel capacitance $C_P$ from said line, said reference capacitance $\Delta C_S$ and said line capacitance $C_S$ that were connected in parallel are charged with said set voltage $V_S$ and, after charging up both of these, said pixel voltage $V_P$ charged on to said pixel capacitance $C_P$ for a prescribed time is held, and said pixel capacitance $C_P$ after the lapse of a prescribed time is further connected in parallel with said parallel-connected reference capacitance $\Delta C_S$ and said line capacitance $C_S$ whereby a difference voltage $\Delta V_{S2}$ between a voltage $V_{a2}$ of said line capacitance $C_S$ after the parallel connection and said set voltage $\Delta V_S$ is measured, wherein a pixel parameter is inspected based on at least one difference voltage of said difference voltages $\Delta V_{S1}$ and $\Delta V_{S2}$, and a value of said pixel capacitance $C_P$ is obtained based on said difference voltages $\Delta V_{S1}$ and $\Delta V_{S2}$ and the following equation:

$$C_P = \Delta C_S \cdot \Delta V_{S1} \cdot \Delta V_{S2} / \{(V_P - V_S) \cdot (\Delta V_{S1} - \Delta V_{S2})\}.$$

5. The method of TFT array inspection according to claim 1 wherein, a pixel parameter is inspected to see whether said pixel parameter is correct, based on at least one difference voltage $\Delta V_S$ of said at least two difference voltages $\Delta V_S$; and obtaining a value of said pixel capacitance $C_P$ based on said at least two difference voltages $\Delta V_S$ and said equation.

6. A method of TFT array inspection comprising:

a capacitance value setting process of setting at least two values as a value of an additional capacitance $C_T$ by changing the value of said additional capacitance $C_T$ with use of at least one reference capacitance $\Delta C_S$ having a known value, said additional capacitance $C_T$ including at least a line capacitance Cs having an unknown value and said additional capacitance $C_T$ being connected in parallel with a pixel capacitance $C_P$ constituting a pixel of a TFT array, during inspection of said pixel;

a charging process of charging said pixel capacitance $C_P$ with a pixel voltage $V_P$ having a known value and charging said additional capacitance $C_T$ with a set voltage $V_S$ having a known value different from said pixel voltage $V_P$; every time each of said at least two values of said additional capacitance $C_T$ is set by said capacitance value setting process;

a difference voltage measuring process of measuring at least two difference voltages $\Delta V_S$ having different values by measuring a difference voltage $\Delta V_S$ between said set voltage $V_S$ and a voltage $V_a$ of said additional capacitance $C_T$ after a parallel connection wherein said pixel capacitance $C_P$ and said additional capacitance $C_T$ are connected in parallel every time after said charging process is finished; and a pixel inspecting process of inspecting said pixel based on said at least two difference voltages $\Delta V_S$ measured by said difference voltage measuring process.

7. The method of TFT array inspection according to claim 6 wherein, said capacitance value setting process is adapted to set two values as a value of said additional capacitance $C_T$; and said difference voltage measuring process is adapted to measure two difference voltages $\Delta V_S$ as said at least two difference voltages $\Delta V_S$.

8. The method of TFT array inspection according to claim 6 wherein, a value of said pixel voltage $C_P$ is set to be a smaller value than that of said set voltage $V_S$; and said charging process is adapted to charge said pixel capacitance $C_P$ with said pixel voltage $V_P$ and to charge said additional capacitance $C_T$ with said set voltage $V_S$ by charging said additional capacitance $C_T$ with said set voltage $V_S$ after charging simultaneously said pixel capacitance $C_P$ and said additional capacitance $C_T$ with said pixel voltage $V_P$.

9. The method of TFT array inspection according to claim 6 wherein, said pixel inspecting process is adapted to obtain a value of said pixel capacitance $C_P$ based on said at least two difference voltages $\Delta V_S$ and a predetermined equation representing said at least two difference voltages $\Delta V_S$.

10. The method of TFT array inspection according to claim 9 wherein, said predetermined equation is the following equation:

$$\Delta V_S = V_a - V_S =: (C_P/C_T) \cdot (V_P - V_S)$$

(where =: means "approximately equal to").

11. The method of TFT array inspection according to claim 5 wherein, said predetermined equation is the following equation:

$$\Delta V_S = V_a - V_S = \{C_P/(C_P + C_T)\} \cdot (V_P - V_S).$$

12. The method of TFT array inspection according to claim 2 wherein, said pixel inspecting process is adapted to inspect a pixel parameter to see whether said pixel parameter is good or not, based on at least one difference voltage $\Delta V_S$ of said at least two difference voltages $\Delta V_S$.

13. The method of TFT array inspection according to claim 8 wherein, said pixel parameter includes a plurality of pixel parameters including a leakage value of said pixel capacitance $C_P$; and said pixel inspecting process is adapted to divide said plurality of pixel parameters into said leakage value and pixel parameters other than said leakage value so as to inspect said leakage value and said pixel parameters other than said leakage value based on respective different voltages $\Delta V_S$.

14. The method of TFT array inspection according to claim 6 wherein, said pixel inspecting process comprises:

a pixel capacitance detecting process of detecting a value of said pixel capacitance $C_P$ based on said at least two difference voltages $\Delta V_S$ and a predetermined equation representing said at least two difference voltages $\Delta V_S$ and a predetermined equation representing said at least two difference voltages $\Delta V_S$; and a pixel parameter inspecting process of inspecting a pixel parameter to see whether said pixel parameter is good or not, based on at least one difference voltage $\Delta V_S$ of said at least two difference voltages $\Delta V_S$.

15. A TFT array inspection device comprising, a capacitance value setting system which sets at least two values as a value of an additional capacitance $C_T$ by changing the value of said additional capacitance $C_T$ with use of at least one reference capacitance $\Delta C_S$ having a known value, said additional capacitance $C_T$ including at least a line capacitance $C_S$ having an unknown value and said additional capacitance $C_T$ being connected in parallel with a pixel capacitance $C_P$ constituting a pixel of a TFT array, during inspection of said pixel;

a charging system which charges said pixel capacitance $C_P$ with a pixel voltage $V_P$ having a known value and which charges said additional capacitance $C_T$ with a set voltage $V_S$ having a known value different from said pixel voltage $V_P$, every time each of said at least two values of said additional capacitance $C_T$ is set by said capacitance value setting system;

a difference voltage measuring system which measures at least two difference voltages $\Delta V_S$ having different values by measuring a difference voltage $\Delta V_S$ between said set voltage $V_S$ and a voltage $V_a$ of said additional capacitance $C_T$ after a parallel connection wherein said pixel capacitance $C_P$ and said additional capacitance $C_T$ are connected in parallel every time after a charging process of said charging system is finished; and a pixel inspecting system which inspects said pixel based on said at least two difference voltages $\Delta V_S$ measured by said difference voltage measuring system.

* * * * *

UNITED STATES PATENT AND TRADEMARK OFFICE
CERTIFICATE OF CORRECTION

PATENT NO. : 6,262,589 B1
DATED : July 17, 2001
INVENTOR(S) : Tadashi Tamukai

It is certified that error appears in the above-identified patent and that said Letters Patent is hereby corrected as shown below:

Column 10,
Line 63, change "$(C_{T>>CP})$" to -- $(C_T>>C_P)$ --

Column 11,
Line 13, change "difference" to -- different --
Line 47, change "$C_P=\Delta C_S \bullet^{\Delta V}{}_{S1} \bullet^{\Delta V}{}_{S2}/\{(V_S-V_S)\bullet(\Delta V_{S1}-\Delta V_{S2})\}$" to
-- $C_P=\Delta C_S \bullet^{\Delta V}{}_{S1} \bullet^{\Delta V}{}_{S2}/\{(V_P-V_S)\bullet(\Delta V_{S1}-\Delta V_{S2})\}$ --

Column 12,
Line 27, change "capacitance "$C_P$ with said pixel voltage $C_P$, and, by" to
-- capacitance $C_P$ with said pixel voltage $V_P$, and, by --

Column 13,
Line 5, change "$V_P$;" to -- $V_P$, --
Line 29, change "$C_P$" to -- $V_P$ --

Signed and Sealed this

Fourth Day of June, 2002

*Attest:*

*Attesting Officer*

JAMES E. ROGAN
*Director of the United States Patent and Trademark Office*